United States Patent [19]

Kohmura et al.

[11] Patent Number: 5,558,721
[45] Date of Patent: Sep. 24, 1996

[54] VAPOR PHASE GROWTH SYSTEM AND A GAS-DRIVE MOTOR

[75] Inventors: Yukio Kohmura, Chiba; Koichi Toyosaki, Kisarazu, both of Japan

[73] Assignee: The Furukawa Electric Co., Ltd., Tokyo, Japan

[21] Appl. No.: 337,056

[22] Filed: Nov. 10, 1994

[30] Foreign Application Priority Data

Nov. 15, 1993 [JP] Japan .................................. 5-285245
May 31, 1994 [JP] Japan .................................. 6-118112

[51] Int. Cl.$^6$ .............................. C23C 16/00; F01D 5/12; F01D 7/00
[52] U.S. Cl. ....................... 118/730; 118/500; 415/122.1; 415/202
[58] Field of Search .................................. 118/725, 730, 118/500; 415/202, 904, 122.1

[56] References Cited

U.S. PATENT DOCUMENTS

| | | | |
|---|---|---|---|
| 3,504,987 | 4/1970 | Dee ................................ | 415/91 |
| 3,608,519 | 9/1971 | Richardson ...................... | 118/48 |
| 3,796,182 | 3/1974 | Rosler ............................ | 118/48 |
| 4,131,916 | 12/1978 | Landsman ...................... | 358/285 |
| 4,566,849 | 1/1986 | Flink ............................. | 415/92 |
| 4,860,687 | 8/1989 | Frijlink ......................... | 118/500 |
| 4,913,600 | 4/1990 | Dierich .......................... | 408/130 |
| 4,976,216 | 12/1990 | Maeda ........................... | 118/728 |
| 5,160,545 | 11/1992 | Maloney ........................ | 118/725 |
| 5,207,835 | 5/1993 | Moore ........................... | 118/725 |
| 5,286,194 | 2/1994 | Horiuchi ........................ | 433/132 |
| 5,358,377 | 10/1994 | Wright .......................... | 415/165 |

FOREIGN PATENT DOCUMENTS

| | | | |
|---|---|---|---|
| 244123 | 10/1987 | Japan ................................ | 118/730 |
| 1216521 | 8/1989 | Japan . | |
| 653142 | 2/1994 | Japan ................................ | 118/730 |
| 8529157 | 6/1986 | United Kingdom ................. | 118/730 |

OTHER PUBLICATIONS

IBM Technical Disclosure Bulletin, Air Driven Motor, R. Adsmond R. G. Hastede, vol. 13, No. 7 Dec. 1970 p. 6 1982.

Primary Examiner—R. Bruce Breneman
Assistant Examiner—Jeffrie R. Lund
Attorney, Agent, or Firm—Frishauf, Holtz, Goodman, Langer & Chick

[57] ABSTRACT

A vapor phase growth system comprises a gas-drive motor including a ring-shaped stator and a rotor housed in a rotor chamber formed in the stator, and designed to rotate the rotor by injecting a gas toward gas receiving grooves in the peripheral surface of the rotor through injection ports which open in the peripheral surface of the rotor chamber. A rotating shaft of a susceptor rotating mechanism extends along the axis of a susceptor in a reactor, and has one end fixed to the top wall of the susceptor. A tray rotating shaft, having one end fixed to each of trays arranged individually in recesses in the outer surface of the susceptor, extends penetrating the peripheral wall of the susceptor. As a rotating shaft of a drive mechanism rotates, a wafer supported by each tray revolves around the rotating shaft. A gear fixed to the other end of the tray rotating shaft is in mesh with a ring gear on the upper end face of a hollow rotating member fixed to the upper surface of the rotor and located coaxially with the rotating shaft of the drive mechanism. As the rotor rotates, each tray is rotated by the tray rotating shaft gear-connected to the hollow rotating member, so that the wafer rotates around the tray rotating shaft. Accordingly, the speeds of rotation and revolution of the wafer can change independently of each other.

19 Claims, 8 Drawing Sheets

5,558,721

VAPOR PHASE GROWTH SYSTEM AND A GAS-DRIVE MOTOR

BACKGROUND OF THE INVENTION

1. Field of the Invention

The present invention relates to a vapor phase growth system and a gas-drive motor, and more particularly, to a vapor phase growth system in which rotating and revolving motions of wafers can be performed separately and independently of each other, a gas-drive motor particularly suited for use as a drive source for wafer rotation in the vapor phase growth system of this type, and a gas-drive motor system having a function to control the rotor rotating speed of the motor.

2. Description of the Related Art

In a conventional vapor phase growth method, a material gas is fed into the reactor along with a carrier gas while wafers held by a susceptor in a reactor are heated through the medium of the susceptor, to thereby carry out vapor phase growth of an epitaxial layer on the surface of each wafer. The epitaxial wafers, obtained by this vapor phase growth method, is subject to a post-treatment, whereby devices of electrical apparatuses are manufactured. In order to improve the yield in the post-treatment and the quality of the devices, differences in the thickness of the epitaxial layer formed on the wafer surface must be reduced.

To attain this, a known vapor phase growth system (Jpn. Pat. Appln. KOKOKU Publication No. 1-216521) is designed so that wafers are revolvable around the axis of a susceptor and rotatable on their own axes. Since the wafers rotate and revolve in a stream of a material gas, according to this apparatus, the material gas can be supplied uniformly to various parts of the wafer surface, so that the differences in the thickness of the epitaxial layer can be reduced.

As described in detail later with reference to FIG. 1, however, the aforesaid conventional vapor phase growth system is arranged so that each wafer rotates on its own axis as it revolves, and the ratio of the wafer rotating speed to the wafer revolving speed is fixed. Accordingly, even though the wafer rotating and revolving speeds are varied, their combination is restricted. Depending on the specifications of the epitaxial wafers, therefore, both the wafer rotating and revolving speeds cannot be adjusted to optimum values, so that the differences in the thickness of the epitaxial layer may increase. In order to change the ratio of the wafer rotating speed to the wafer revolving speed, moreover, gears and other relevant parts of a drive system for wafer rotation/revolution must be replaced, so that the manufacturing efficiency of the epitaxial wafers is lowered.

Since the susceptor is heated to increase the wafer temperature to a proper level, as described above, the surroundings of the susceptor are heated to a high temperature. In some cases, furthermore, the reactor may be decompressed in order to restrain auto-doping of the wafers. Thus, the vapor phase growth system may be operated at high temperature or under reduced pressure.

If the apparatus is operated at high temperature with use of a conventional electric motor as the drive source for wafer rotation/revolution, electrical supply to the motor may possibly cause an insulating coating film on ordinary insulated windings to be deteriorated or fuse. If the apparatus is operated under reduced pressure, moreover, the insulating film may produce impurity gases.

To cope with this, a gas-drive motor has been tried as a drive source for wafer rotation/revolution which requires no electrical supply and has no problems aroused by the use of insulated windings. The conventional gas-drive motor is provided with a rotor which is located in a stator and has a plurality of vanes, and is designed so that the rotor rotates when a gas is jetted against the vanes.

However, the gas-drive motor of the vane type is subject to some drawbacks. Since the rotor is generally supported in the stator by means of bearings, it undergoes vibration which is attributable to sliding friction with the bearings as it rotates, so that a smooth rotational output cannot be obtained. In order to increase the rotor output torque, moreover, the vane-type gas-drive motor is furnished with a speed reducer. If this motor is used under reduced pressure, therefore, lubricating oil which is applied to the reducer evaporates. Furthermore, output rotating speed control of the motor of this type is a hard task.

SUMMARY OF THE INVENTION

An object of the present invention is to provide a vapor phase growth system capable of performing wafer rotating and revolving operations separately and independently.

Another object of the invention is to provide a gas-drive motor capable of smoothly delivering rotational outputs, workable at high temperature or under reduced pressure, and capable of output speed control.

Still another object of the invention is to provide a gas-drive motor adapted for use as a drive source for wafer rotation in a vapor phase growth system.

A further object of the invention is to provide a gas-drive motor system having a function to control the rotor rotating speed of a gas-drive motor.

A vapor phase growth system according to one aspect of the present invention comprises a reactor receiving therein a susceptor, a tray arranged along the outer surface of the susceptor so as to be rotatable around the axis of the tray and adapted to support a wafer, a gas-drive motor including a stator and a rotor rotatable with respect to the stator, and a transmission mechanism coupled to the rotor on one side and to the tray on the other side.

According to this vapor phase growth system, the wafer can be caused to rotate on its own axis through the medium of the transmission mechanism and the tray by driving the gas-drive motor. Also, the wafer rotating speed can be set freely, and hence, adjusted to an optimum value for vapor phase growth, so that differences in the thickness of an epitaxial layer formed on the wafer surface can be reduced. Thus, the yield of epitaxial wafers in a post-treatment process can be increased, and the quality of devices of electrical apparatuses which are manufactured by using the wafers can be improved. Since the gas-drive motor, which requires no use of insulated wires for electrical supply, is used as a drive source for wafer rotation, the vapor phase growth system is suited for applications at high temperature or reduced pressure. Since a gas for motor drive is jetted against the gas-drive motor to cool it during the operation of the motor, the motor can stand high-temperature use.

Preferably, the transmission mechanism includes a rotating member having one end thereof fixed to the rotor and the other end formed with a gear, a shaft member having one end thereof fixed to the tray, and a gear fixed to the other end of the shaft member and in mesh with the gear of the rotating member. According to this preferred embodiment, the tray and the rotor of the gas-drive motor are connected by means of the transmission mechanism with a simple construction, so that the wafer can smoothly rotate on its own axis.

Preferably, the vapor phase growth system further comprises a drive mechanism for rotating the susceptor. The tray rotates around the axis of the susceptor as the susceptor rotates. According to this preferred embodiment, the tray and hence the wafer can be revolved around the axis of the susceptor by driving the drive mechanism. Since the drive mechanism is provided separately from the gas-drive motor and the transmission mechanism, moreover, wafer rotating and revolving speeds can be set independently as required. Accordingly, a desired one or both of wafer rotating and revolving operations can be carried out at optimum speeds for vapor phase growth. Thus, the differences in the thickness of the epitaxial layer can be reduced.

Preferably, the susceptor has a top wall and a peripheral wall which cooperates with the top wall to define a hollow portion. The transmission mechanism includes a hollow rotating member extending along the axis of the susceptor, having one end thereof fixed to the rotor and the other end formed with a ring gear, and having a hollow portion inside, a shaft member having one end thereof fixed to the tray and penetrating the peripheral wall of the susceptor, and a gear fixed to the other end of the shaft member and in mesh with the ring gear of the hollow rotating member. The stator and the rotor of the gas-drive motor are ring-shaped, and the ring-shaped stator defines a center hole. The drive mechanism has a rotating shaft extending along the axis of the susceptor through the center hole of the gas-drive motor and the respective hollow portions of the hollow rotating member and the susceptor, and the rotating shaft is fixed at one end thereof to the top wall of the susceptor.

According to this preferred embodiment, the gas-drive motor and the transmission mechanism for wafer rotation are arranged coaxially with the rotating shaft of the drive mechanism for wafer revolution. Accordingly, the motor and the transmission mechanism never interfere with the drive mechanism, so that the wafer rotating and revolving operations can be carried out independently of each other. Also, the vapor phase growth system can be made compact.

Preferably, the rotating shaft of the drive mechanism is movable in the axial direction of the susceptor, and the stator of the gas-drive motor is fixed to the rotating shaft. According to this preferred embodiment, the susceptor can be raised or lowered in the reactor by moving the rotating shaft. Moreover, the gas-drive motor and the transmission mechanism are moved together with the rotating shaft of the drive mechanism, so that they never hinder the movement of the susceptor, thus ensuring smooth ascent and descent of the susceptor.

According to another aspect of the present invention, there is provided a gas-drive motor which comprises a stator formed with a rotor chamber and a rotor received in the rotor chamber so as to be liftable and rotatable with respect to the stator. The stator is formed with a first gas passage having a first gas injection port opening in the bottom face of the rotor chamber of the stator and a second gas passage having a second gas injection port opening in the peripheral surface of the rotor chamber of the stator. The rotor has a bottom face and a peripheral surface formed with a plurality of gas receiving recesses.

According to this gas-drive motor, the rotor can be lifted by jetting the gas against the bottom face of the rotor through the first gas injection port, and rotated by jetting the gas against the gas receiving recesses of the rotor through the second gas injection port. Moreover, the gas for rotor lifting can be supplied through a path separate from a rotor rotation gas feed path, so that the rotor lifting can be adjusted to a suitable state without regard to the weight of the rotor. This gas-drive motor is adapted for use as the motor of the vapor phase growth system of the aforementioned type.

Preferably, the first gas passage includes a first gas injection passage having the first injection port, a first gas supply passage communicating therewith, and a first gas reservoir interposed between the first gas injection passage and the first gas supply passage. The second gas passage includes a second gas injection passage having the second injection port, a second gas supply passage communicating therewith, and a second gas reservoir interposed between the second gas injection passage and the second gas supply passage. According to this preferred embodiment, when the gas supplied to the first gas reservoir through the first gas supply passage is injected through the injection port of the first gas injection passage, the injected gas pressure is stabilized by the accumulator function of the gas reservoir, thus ensuring stable rotor lifting. For the same reason, the rotor can be rotated with stability.

Preferably, the second gas passage includes a forward rotor rotation gas injection passage having a gas injection port and a reverse rotor rotation gas injection passage having a gas injection port. The forward rotor rotation gas injection passage extends in a direction such that a gas injected from the gas injection port thereof toward a corresponding one or ones of the gas receiving recesses in the peripheral surface of the rotor acts so as to rotate the rotor in the forward direction. The reverse rotor rotation gas injection passage extends in a direction such that a gas injected from the gas injection port thereof toward a corresponding one or ones of the gas receiving recesses in the peripheral surface of the rotor acts so as to rotate the rotor in the reverse direction. According to this preferred embodiment, the rotor can be rotated alternatively in the forward or reverse direction by injecting the gas toward the gas receiving recesses of the rotor through the injection port of the forward or reverse rotor rotation gas injection passage, and moreover, the rotor rotating speed can be controlled with ease.

Preferably, the second gas passage includes a forward rotor rotation gas reservoir communicating with that end of the forward rotor rotation gas injection passage which is situated on the side opposite from the gas injection port thereof, and a reverse rotor rotation gas reservoir communicating with that end of the reverse rotor rotation gas injection passage which is situated on the side opposite from the gas injection port thereof. According to this preferred embodiment, the rotor can be rotated steadily in the forward and reverse directions.

Preferably, the stator has an outer peripheral wall and an inner peripheral wall which cooperates with the outer peripheral wall to define the rotor chamber, and the rotor has outer and inner peripheral surfaces. The gas receiving recesses include a plurality of forward rotor rotation gas receiving recesses formed in one of the outer and inner peripheral surfaces of the rotor and a plurality of reverse rotor rotation gas receiving recesses formed in the other of the outer and inner peripheral surfaces of the rotor. The second gas passage includes a forward rotor rotation gas injection passage having a gas injection port opening in that one of the respective outer surfaces of the outer and inner peripheral walls of the stator which corresponds to one of the outer and inner peripheral surfaces of the rotor, and a reverse rotor rotation gas injection passage having a gas injection port opening in that one of the respective outer surfaces of the outer and inner peripheral walls of the stator which corresponds to the other of the outer and inner peripheral surfaces of the rotor.

According to this preferred embodiment, the forward and reverse rotor rotation gases can be prevented from interfering with each other as they are injected toward the different peripheral surfaces of the rotor, so that the forward and reverse rotations of the rotor and the rotor rotating speed control can be effected properly. Since the gas injection port of the forward rotor rotation gas injection passage opens in the outer peripheral surface of the rotor, moreover, the turning moment for forward rotor rotation can be applied efficiently to the rotor.

According to still another aspect of the present invention, there is provided a gas-drive motor system which comprises: a gas-drive motor including a stator, which is formed with a rotor chamber, a first gas passage having a first gas injection port opening in the bottom face of the rotor chamber, and a second gas passage including forward and reverse rotor rotation gas injection passages having their respective gas injection ports, a rotor received in the rotor chamber so as to be liftable and rotatable with respect to the stator and having a bottom face and a peripheral surface formed with a plurality of gas receiving recesses; and a gas supply control device for controlling the supply of the gases to the forward rotor rotation gas injection passage and the reverse rotor rotation gas injection passage. According to this gas-drive motor system, the forward and reverse rotations of the rotor and the rotor rotating speed control can be effected. Also, this system is adapted for in the vapor phase growth system of the aforementioned type.

Preferably, the controller of the gas supply control device operates so as to stop a corresponding one of the gas supply to the forward rotor rotation gas injection passage and the gas supply to the reverse rotor rotation gas injection passage and start the other of the gas supply to the forward rotor rotation gas injection passage and the gas supply to the reverse rotor rotation gas injection passage when the rotor rotating speed is deviated from the target speed. According to this preferred embodiment, rotor rotating speed control can be effected easily and smoothly.

Preferably, the controller of the gas supply control device operates so as to start a corresponding one of the gas supply to the forward rotor rotation gas injection passage and the gas supply to the reverse rotor rotation gas injection passage when the rotor rotating speed is deviated from the target speed while continuing the other of the gas supply to the forward rotor rotation gas injection passage and the gas supply to the reverse rotor rotation gas injection passage. According to this preferred embodiment, the rotor can enjoy a stable constant-speed rotation.

DETAILED DESCRIPTION

Prior to the description of a vapor phase growth system according to the present invention, a conventional vapor phase growth system described in Jpn. Pat. Appln. KOKAI Publication No. 1-216521 will be explained in brief.

Figure 1:
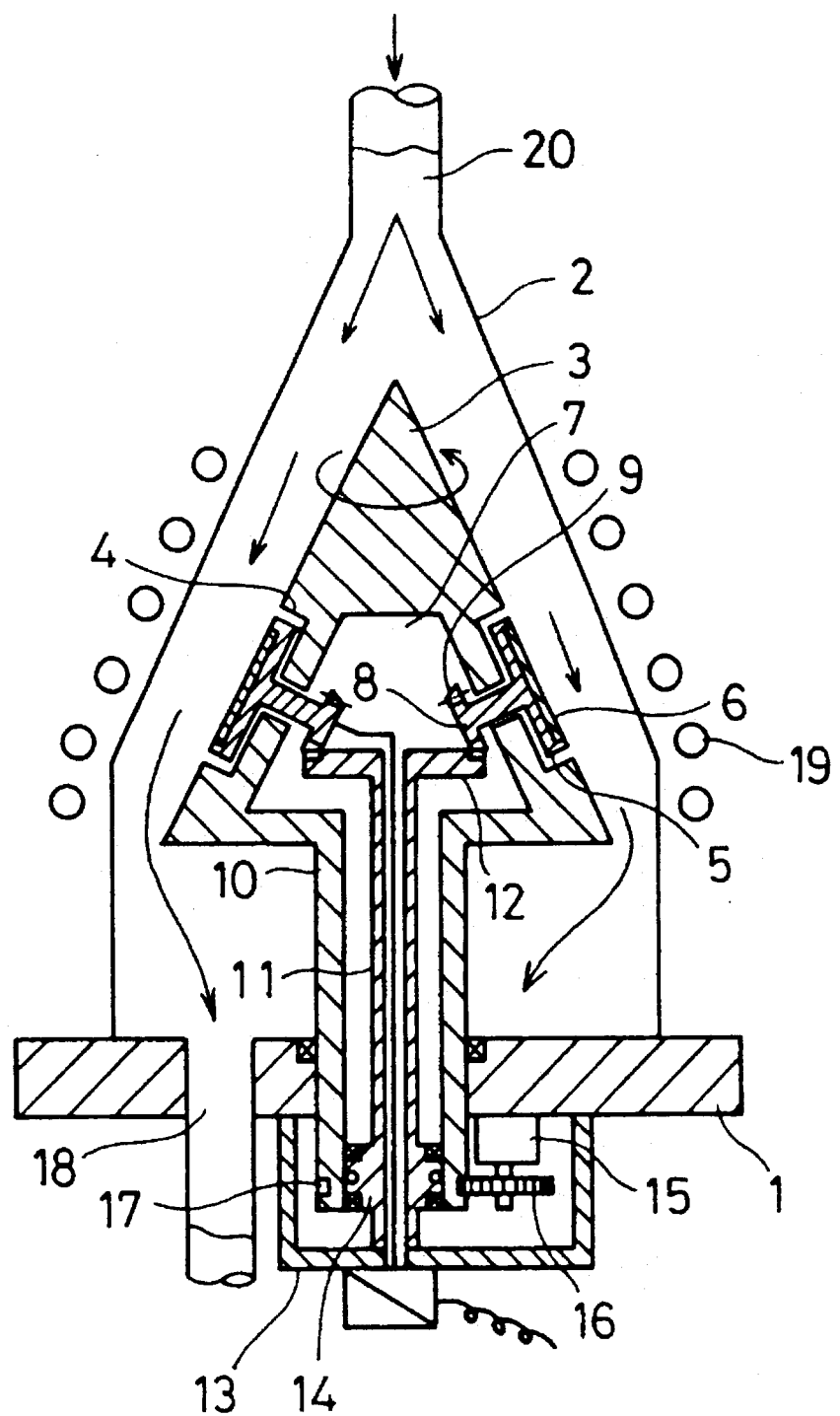
FIG. 1 is a vertical sectional view showing a conventional vapor phase growth system.

Referring to FIG. 1,, this conventional apparatus has a base 1 which carries a reactor 2 thereon, and a conical susceptor 3 is rotatably disposed in the reactor 2. A gear chamber 7 is defined in the susceptor 3 by the peripheral and bottom walls thereof. The susceptor 3 is formed with a plurality of recesses 4 in its peripheral surface, and a tray 5 for supporting a wafer 6 is located in each recess 4. A tray rotating shaft 8, which is formed integrally with the tray 5, extends into the gear chamber 7 through the peripheral wall of the susceptor 3, and is rotatably supported by the susceptor 3. Also, a tray rotating gear 9 is fixed to the inner end of the rotating shaft 8.

A hollow shaft 10, which is formed integrally with the susceptor 3, extends downward along the axis of the susceptor from the bottom wall thereof, and penetrates the base 1. A shaft 11 extends through the hollow shaft 10 so as to be coaxial therewith. The lower end of the shaft 11 is fixed to the inner surface of a casing 13, which is fixed to the lower surface of the base 1 so as to surround the shafts 10 and 11. A bottom opening of the hollow shaft 10 is closed by means of a sealing member 14.

A gear 16 is fixed to the output shaft of a motor 15 which is fixed to the lower surface of the base 1. The gear 16 is in mesh with a gear 17 which is formed on the outer peripheral surface of the lower end portion of the hollow shaft 10. When the motor output shaft rotates, therefore, the susceptor 3 rotates so that the tray 5 revolves around the axis of the susceptor. The fixed shaft 11 is formed with a ring gear 12 on its upper end, which is in mesh with the tray rotating gear 9. As the tray 5 revolves around the susceptor axis, it also rotates on its own axis.

In the conventional vapor phase growth system described above, the susceptor 3 is heated by electromagnetic induction by means of a high-frequency heating coil 19 so that the wafer 6 is heated as a material gas and a carrier gas are fed through a gas feed port 20 of the reactor 2, whereby an epitaxial layer is formed on the surface of the wafer 6 by vapor phase growth. Exhaust gases are discharged through an exhaust port 18.

When the hollow shaft 10 is rotated by means of the motor 15 during this vapor phase growth, the susceptor 3 rotates around the axis of the shaft 10, whereupon the wafer 6 revolves around the axis of the shaft 10 and rotates about the axis of the tray 5. By rotating and revolving the wafer 6 in this manner, differences in the thickness of the epitaxial layer can be reduced. However, the rotating speed of the wafer 6 depends on the rotating speed of the susceptor 3 (or wafer revolving speed), so that the former is automatically settled when the latter is settled. In some cases, therefore, both the rotating and revolving speeds of the wafer 6 cannot be optimized, and the differences in the thickness of the epitaxial layer cannot be reduced further.

Figure 2:
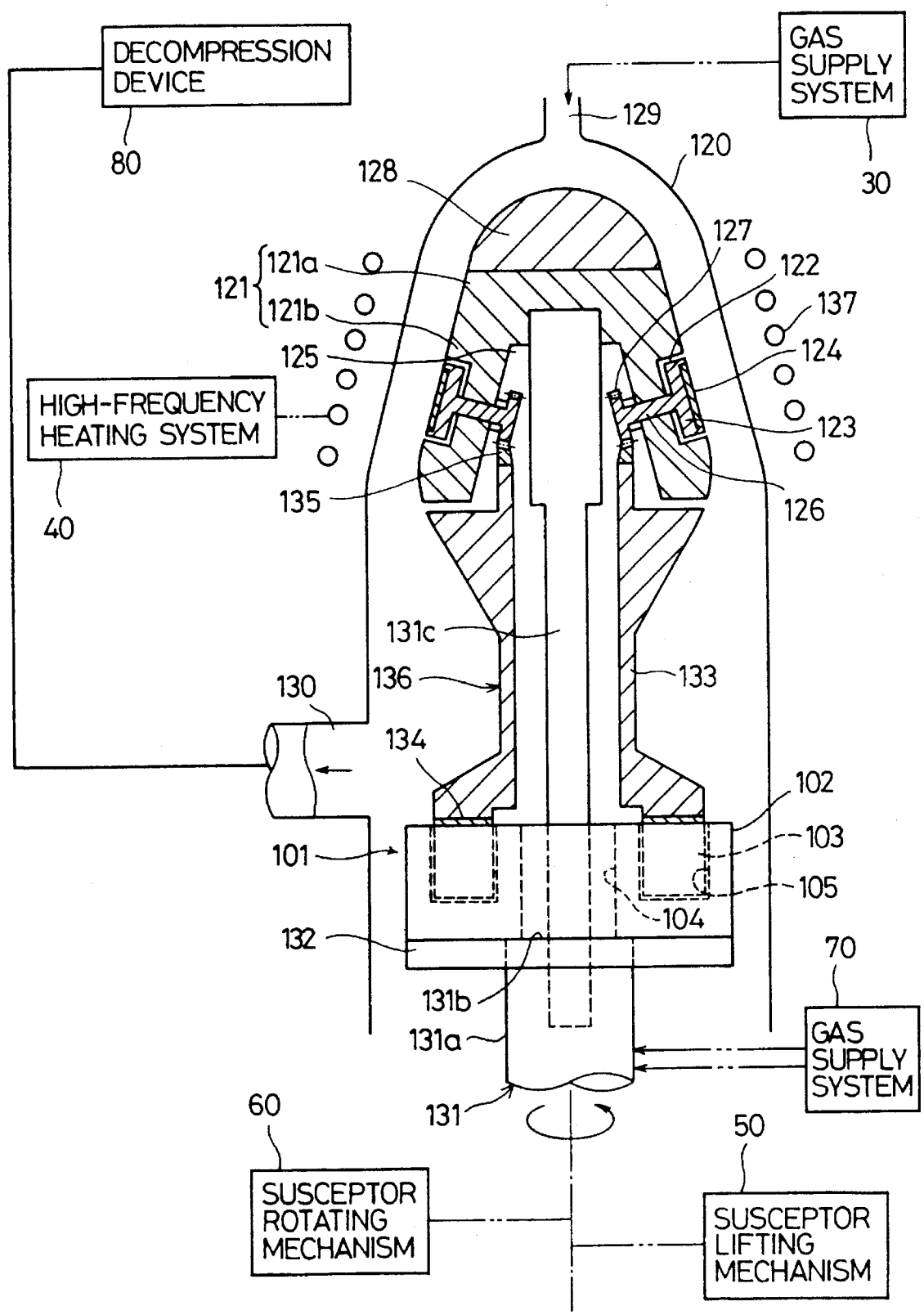
FIG. 2 is a vertical sectional view showing a vapor phase growth system according to a first embodiment of the present invention.

Referring now to FIG. 2, a vapor phase growth system according to a first embodiment of the present invention will be described.

This vapor phase growth system comprises a hollow cylindrical reactor 120 made of glass and a graphite susceptor 121 located in the reactor so as to be coaxial therewith. In this apparatus, the susceptor 121 is heated by high-frequency induction by means of a high-frequency heating coil 137 outside the reactor 120 so that wafers 124 are heated as a material gas and a carrier gas are fed into the reactor 120, whereby an epitaxial layer is formed on the surface of each wafer 124 by vapor phase growth.

Reference numeral 30 denotes a gas supply system which communicates with a gas feed port 129 of the reactor 120. This gas supply system includes, for example, a material gas cylinder, a carrier gas cylinder, pipes which connect these cylinders and the reactor 120, and control valves for individually controlling the pressures and flow rates of gases flowing through the pipes. $AsH_3$ (arsine), TMGa (trimethyl gallium), TMA1 (trimethyl aluminum) or the like may be used as the material gas, and $H_2$ or the like as the carrier gas. In FIG. 2, numeral 130 denotes an exhaust port through which the gases in the reactor 120 are discharged.

A high-frequency heating system 40 includes, for example, a power source for the high-frequency heating coil 137, a pyrometer for detecting the surface temperature of the wafers 124, and a control circuit for controlling the value of current flowing through the coil 137.

The susceptor 121 has a top wall 121a and a peripheral wall 121b which define a gear chamber 125 in the susceptor in cooperation with each other, and has the shape of a hollow truncated cone as a whole. The bottom of the susceptor 121 is open. A cap 128 for stabilizing (or streamlining) flows of the material gas and the carrier gas is fixed to the top face of the susceptor top wall 121a. The cap 128 has a semicircular profile and shares the horizontal sectional shape and size with the susceptor top face.

The vapor phase growth system is provided with a drive mechanism for rotating and lifting the susceptor 121. The drive mechanism includes a rotating shaft 131 which extends along the reactor axis and susceptor axis in the reactor. The shaft 131 has a large-diameter portion 131a, which is preferably formed of stainless steel, and a small-diameter portion 131c, which is connected to the large-diameter portion 131a and preferably formed of quartz glass. The large-diameter portion 131a is operatively coupled to a susceptor lifting mechanism 50 and a susceptor rotating mechanism 60, and one end of the small-diameter portion 131c is fixed to the bottom face of the susceptor top wall 121a.

The susceptor lifting mechanism 50 includes, for example, an electric motor for rotating a pinion gear which is in mesh with a rack formed on the peripheral surface of the large-diameter portion 131a of the rotating shaft 131 so as to extend along the axis of the shaft 131, a sensor for detecting the axial position of a predetermined part of the large-diameter portion 131a, and a control section for controlling the operation of the electric motor. By rotating the output shaft of the motor forward or reversely, the rotating shaft 131 is caused to raise or lower the susceptor 121. Also, the susceptor rotating mechanism 60 includes, for example, an electric motor having its output shaft operatively coupled to the large-diameter portion 131a, a sensor for detecting the rotating speed of the large-diameter portion 131a, and a control section for controlling the operation of the electric motor. By rotating the output shaft of the motor, the rotating shaft 131 is caused to rotate the susceptor 121 at a required speed.

The vapor phase growth system further comprises a rotating mechanism (tray rotating mechanism) 136 for rotating the wafers 124. The wafer rotating mechanism 136 includes trays (two of which are designated by reference numeral 123) for individually supporting the wafers 124. Each tray 123 is housed in its corresponding one of recesses 122 which are formed in the outer surface of the peripheral wall 121b of the susceptor 121. The outer end of a tray rotating shaft 126 is fixed to the bottom of the tray 123. The shaft 126 extends through the susceptor peripheral wall 121b into the gear chamber 125, and is rotatably supported by means of the susceptor 121. A tray rotating gear 127 is fixed to the inner end of the rotating shaft 126.

A gas-drive motor 101 of the wafer rotating mechanism includes a stator 102 which is fixed to a stepped portion 131b of the rotating shaft 131. The stator 102 is formed, in its central portion, with a through hole 104 through which the small-diameter portion 131c of the rotating shaft 131 is loosely passed. Also, the stator 102 is formed with an open-topped rotor chamber 105 which is coaxial with the through hole 104. A rotor 103 is contained in the rotor chamber 105 so as to be rotatable relatively to the stator 102. The stator 102 and the rotor 103 are formed of stainless steel, for example. As described in detail later, the gas-drive motor 101 is designed so that a gas is injected toward the rotor 103 to rotate it.

The wafer rotating mechanism further includes a transmission mechanism for transmitting the rotation of the rotor 103 to the trays 123. The transmission mechanism is provided with a hollow gear stand 133 which is interposed between the susceptor 121 and the gas-drive motor 101 in the reactor 120. The gear stand 133 has a top face which shares the sectional shape and size with the susceptor bottom face. The outside diameter of the stand 133 gradually decreases from the top face toward the middle portion thereof, and then gradually increases from the middle portion toward the lower end portion. Thus, the gear stand 133 has an external shape such that it never disturbs the gas flow around the susceptor 121.

The bottom face of the gear stand 133 is fixed to the upper surface of the rotor 103 with a low-thermal conduction member 34 between them. Moreover, the stand 133 has a ring-shaped extension portion which projects from its top face into the gear chamber 125 and has an open upper end face. The upper end face of the extension portion is formed with a ring gear 135 which is in mesh with a plurality of tray rotating gears 127. Thus, the wafer 124 placed on each tray 123 rotates around the axis of its corresponding tray rotating shaft 126 as the rotor 103 of the gas-drive motor 101 rotates.

In FIG. 2, reference numeral 132 denotes a gas manifold which is used to supply the gas-drive motor 101 with a gas (e.g., hydrogen, preferably inert gas with high molecular weight, such as nitrogen, argon, etc.) for rotor lifting and the same gas for rotor rotation, from a gas supply system 70. The manifold 132 is fixed to the rotating shaft 131. The gas manifold 132 is formed with gas supply passages (not shown) through which the gases for rotor lifting and rotor rotation flow individually.

The gas supply system 70 includes, for example, a gas cylinder, pipes or hoses, e.g. two in number, extending from the gas cylinder, and control valves for individually controlling the pressures and flow rates of gases flowing through the pipes or hoses. The lower-course end of each pipe or hose communicates with its corresponding one of gas supply passages of the gas manifold 132 by means of an annular gas supply passage (not shown), which opens in the peripheral surface of the large-diameter portion 131a of the rotating shaft 131, and a gas supply passage (not shown) which is formed in the large-diameter portion 131a so as to extend in the longitudinal direction of the rotating shaft.

Preferably, the vapor phase growth system is provided with a decompression device 80 which includes a vacuum pump, pressure gauge, etc., and which is used to decompress the reactor 120. The system is arranged such that the reactor 120 can be kept airtight inside.

Figure 3:
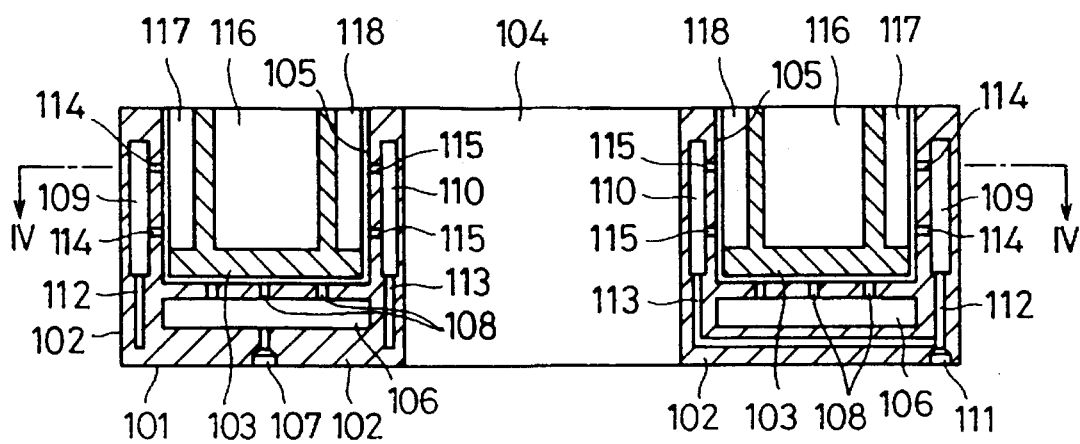
FIG. 3 is a vertical sectional view showing a gas-drive motor of the vapor phase growth system of FIG. 2.
Figure 4:
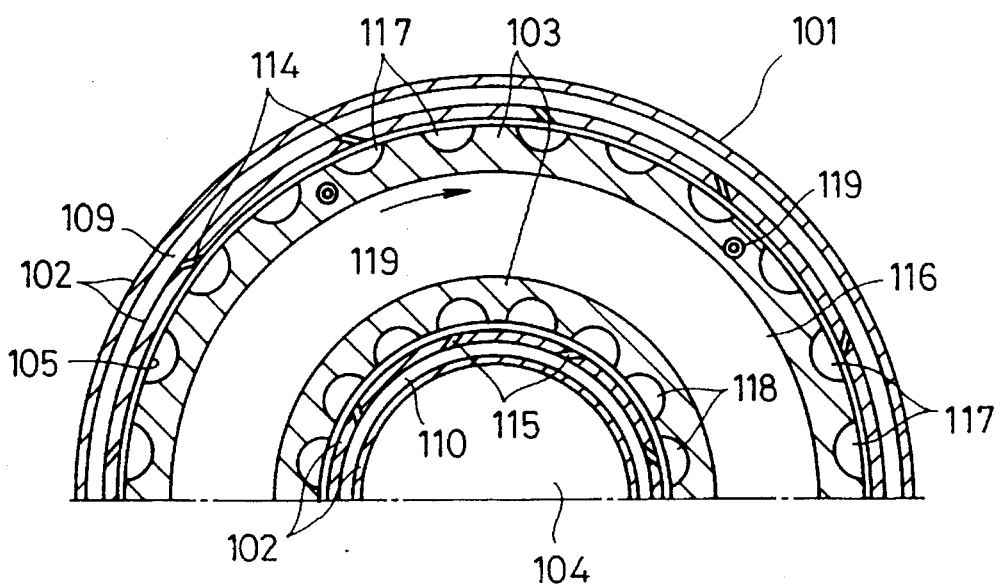
FIG. 4 is a horizontal sectional view of a half of the gas-drive motor taken along line IV—IV of FIG. 3.

Referring now to FIGS. 3 and 4, the gas-drive motor 101 will be described in detail.

The gas-drive motor 101 injects the gas from the stator side toward the rotor 103, thereby rotating the rotor with respect to the stator 102. As the rotor 103 is rotated in this manner, it is lifted from the stator 102.

The stator 102 has outer and inner peripheral walls and a ring-shaped bottom wall which, in conjunction with the peripheral walls, defines the rotor chamber 105.

In connection with the aforesaid injection of the gas for rotor lifting, the bottom wall of the stator 102 is formed with an annular first gas reservoir 106, one or more first gas supply passages 107, and a plurality of first gas injection passages 108 which extend parallel to the axis of the susceptor 121. One end of each of the passages 107 and 108 opens into the first gas reservoir 106. The other end (first gas feed port) of each passage 107 opens in the underside of the bottom wall of the stator 102, and communicates with a gas passage for rotor lifting in the gas manifold 132. The other end (first gas injection port) of each first gas injection passage 108 opens in the upper surface (rotor chamber 105) of the bottom wall of the stator 102. Thus, when the gas for rotor lifting is supplied from the gas supply system 70 to the gas-drive motor 101, it is injected upward into the rotor chamber 105 through the first gas injection passages 108, thereby lifting the rotor 103.

In connection with the injection of the gas for rotor rotation, the outer peripheral wall of the stator 102 is formed with an annular second gas reservoir 109, one or more second gas supply passages 112, and a plurality of second gas injection passages 114. One end of each of the passages 112 and 114 opens into the second gas reservoir 109. The other end of each passage 112 opens in the underside of the outer peripheral wall of the stator 102, and communicates with a second gas feed port 111 which communicates with a gas passage for rotor rotation in the gas manifold 132. The other end (second gas injection port) of each passage 114 opens in the inner peripheral surface of the outer peripheral wall of the stator 102. Each passage 114 extends horizontally as viewed from the front of the apparatus (FIG. 3), and across a tangent to that portion of the inner peripheral surface of the outer peripheral wall of the stator 102 at which the passage 114 is formed, as in a plan view (FIG. 4).

Moreover, the inner peripheral wall of the stator 102 is formed with an annular third gas reservoir 110 and a plurality of third gas injection passages 115. One end of each passage 115 opens into the reservoir 110. Each passage 115 extends horizontally as viewed from the front of the apparatus, and across a tangent to that portion of the outer peripheral surface of the inner peripheral wall of the stator 102 at which the passage 115 is formed, as in a plan view. The other end (third gas injection port) of each passage 115 opens in the outer peripheral surface of the inner peripheral wall of the stator 102. Also, one or more third gas supply passages 113 are provided in association with the gas reservoir 110. Each passage 113 extends downward in the inner peripheral wall of the stator 102 from the reservoir 110, and further extends horizontally in the bottom wall of the stator 102 under the first gas reservoir 106, thus reaching the second gas feed port 111.

In connection with the injection of the gas for rotor rotation, as shown in FIGS. 3 and 4, the outer peripheral surface of the rotor 103 is provided with a number of rotor rotation gas receiving grooves 117 which are arranged at predetermined intervals in the circumferential direction of the rotor. Each groove 117 has a semicircular horizontal section, and extends up to the upper end of the rotor 103 from a position below the lowest second gas injection passage 114. The inner peripheral surface of the rotor 103 is also provided with a number of rotor rotation gas receiving grooves 118 which resemble the grooves 117.

In the gas-drive motor 101 according to the present embodiment, the outside and inside diameters of the stator 102 are 250 mm and 50 mm, respectively, the distances between the inner peripheral surface of the outer peripheral wall of the stator 102 and the outer peripheral surface of the rotor 103 and between the outer peripheral surface of the inner peripheral wall of the stator and the inner peripheral surface of the rotor range from 30 to 120 μm, and the radius of each of the semicircular gas receiving grooves 117 and 118 is adjusted to 2 to 5 mm.

As shown in FIG. 3, moreover, the rotor 103 is formed with an open-topped hollow portion 116 which is coaxial therewith, whereby the rotor is reduced in weight. As shown in FIG. 4, moreover, tapped holes 119 are formed in the top face of the rotor 103. The gear stand 133 can be mounted by means of screws (not shown) which are adapted to be threadedly fitted in the holes 119.

When the gas for rotor rotation is supplied from the gas supply system 70 to the gas-drive motor 101 constructed in the manner described above, it is injected horizontally and across a tangent to the peripheral surface of the rotor 103, toward the gas receiving grooves 117 and 118 of the rotor through the second and third gas injection passages 114 and 115. Both the gas injected toward the grooves 117 through the second injection passages 114 and the gas injected toward the grooves 118 through the third injection passages 115 act so as to rotate the rotor 103 in the direction indicated by the arrow in FIG. 4. When the rotor 103 thus rotates in the direction of the arrow, the wafer 124 is caused to rotate on its own axis.

The rotor rotating speed of the gas-drive motor 101 can be changed in order to adjust the rotating speed of the wafer 124 variably. An experiment was conducted such that the gas for rotor lifting was fed to the motor 101 at a rate of 8 1/min as the rate of feed of the gas for rotor rotation to the motor 101 was varied from about 10 1/min to about 40 1/min. Thereupon, the rotor rotating speed changed from more than about 20 rpm to about 100 rpm, shown in FIG. 5. Thus, the rotor rotating speed increases as the rate of feed of the gas for rotor rotation increases.

According to the result of another experiment, moreover, it was indicated that the gas-drive motor 101 can be used even under reduced pressure, and the rates of feed of the gases for rotor lifting and rotation under reduced pressure can be made much lower than when the motor is operated under atmospheric pressure. This is believed to be attributable to the fact that the pressure loss and pressure resistance are lessened under reduced pressure. Under a pressure of 10 to 760 Torr (1,300 to $10^5$ Pa), for example, the motor was able to be operated suitably by feeding nitrogen gas as the gas for rotor lifting at a rate of 2 to 3 1/min and nitrogen gas as the gas for rotor rotation at a rate of 20 to 30 1/min.

Figure 6:
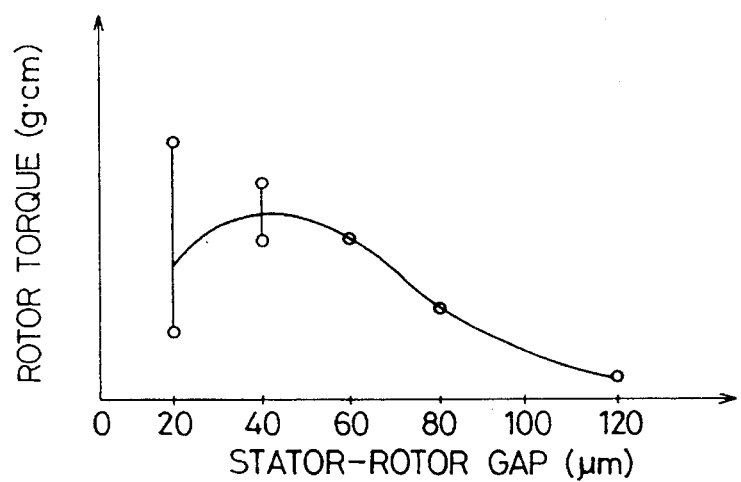
FIG. 6 is a graph for illustrating, by way of example, the relationship between the stator-rotor gap and rotor torque in the gas-drive motor.

The result shown in FIG. 6 was obtained when the gap between the stator 102 and the rotor 103 incorporated in the gas-drive motor 101 was changed within the range from about 20 to 120 μm by replacing the stator and the rotor as the rotor torque was measured at normal temperature. More specifically, the rotor torque took its maximum value when the stator-rotor gap was 40 μm or thereabout. According to still another experiment, the size of the stator-rotor gap for the maximum rotor torque value became greater than the gap size obtained at normal temperature as the ambient temperature increases. When using the motor 101 at high temperature, therefore, the stator-rotor gap should be set at a value greater than the value for normal temperature, in order to increase the rotor torque.

Figure 7:
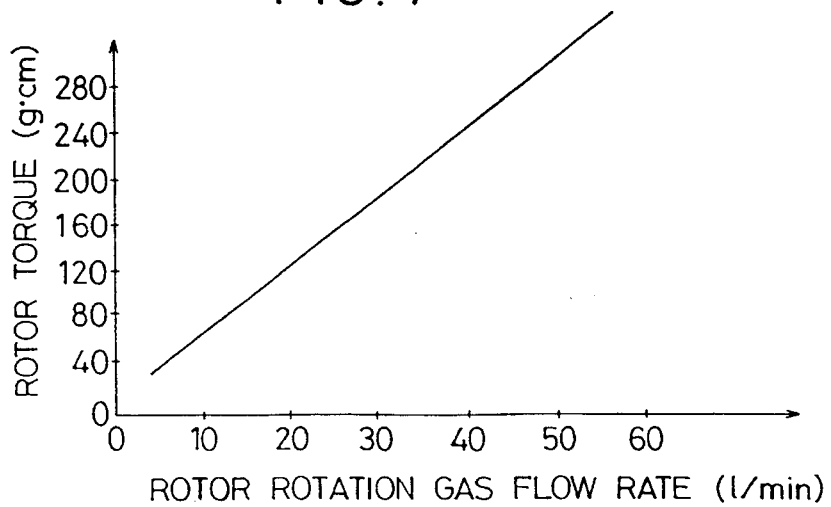
FIG. 7 is a graph for illustrating, by way of example, the relationship between the rotor rotation gas flow rate and rotor torque in the gas-drive motor.

The result shown in FIG. 7 was obtained when the rate of feed of the nitrogen gas as the gas for rotor rotation was changed within the range from about 10 to 50 1/min as the rotor torque of the gas-drive motor 101 with the stator-rotor gap of 30 μm was measured at normal temperature. More specifically, it was indicated that the rotor torque changes in proportion to the feed rate of the gas for rotor rotation.

The following is a description of the operation of the vapor phase growth system shown in FIG. 2 which is provided with the gas-drive motor 101 shown in FIGS. 3 and 4.

After the vapor phase growth system is set up in the manner shown in FIG. 2 by mounting mirror wafers 124 on their corresponding trays 123, for example, the decompression device 80 is driven to decompress the reactor 120 to a predetermined pressure (e.g., 10 to 400 Torr). Then, the high-frequency heating system 40 is driven to cause a required current to flow through the high-frequency heating coil 137. By doing this, the susceptor 121 is heated by high-frequency induction so that the wafers 124 are heated to a predetermined temperature (e.g., 600 to 900° C.). In order to cause the wafers 124 to rotate and revolve, the gas supply system 70 and the susceptor rotating mechanism 60 are driven.

More specifically, the control valves of the gas supply system 70 associated with rotor lifting are actuated, so that the gas for rotor lifting from the system 70 is supplied to the first gas supply passage or passages 107 of the stator 102 of the gas-drive motor 101 through its corresponding gas supply passages in the rotating shaft 131 and the gas manifold 132, and then flows into the first gas reservoir 106. The gas for rotor lifting in the reservoir 106 is injected upward into the rotor chamber 105 through the respective injection ports of the first gas injection passages 108, thereby lifting the rotor 103 in the chamber 105 from the stator 102.

According to the present embodiment, the gas supply passages for rotor lifting and rotor rotation are provided independently of each other, so that the gas for rotor lifting can be fed at a rate corresponding to the weight of the rotor 103, and the lift of the rotor can be adjusted to a suitable value without regard to the rotor weight. Since the gas for rotor lifting is stored in the reservoir 106, moreover, its pressure is stabilized in the reservoir 106, so that the rotor lifting operation can be performed with stability. Since the rotor 103 is lifted from the stator 102 by means of the gas pressure or retained by means of a gas bearing, frictional resistance which acts on the rotor 103 can be made very low.

Subsequently, when the control valves of the gas supply system 70 associated with rotor rotation are actuated, the gas for rotor rotation from the system 70 flows into the second and third gas reservoirs 109 and 110 through its corresponding gas supply passages in the rotating shaft 131 and the gas manifold 132, the second gas feed port 111 of the stator 102, and the second and third gas supply passages 112 and 113 which communicate with the port 111. The gas for rotor rotation in the second and third gas reservoirs 109 and 110 is injected horizontally and across a tangent to the peripheral surface of the rotor 103, toward the gas receiving grooves 117 and 118 of the rotor through the injections ports of the second and third gas injection passages 114 and 115. As a result, the rotor 103 rotates in the direction indicated by the arrow in FIG. 4. Moreover, the pressure of the gas for rotor rotation is stabilized in the gas reservoirs 109 and 110, so that the rotor 103 is rotated with stability.

As the rotor 103 rotates in this manner, the gear stand 133 fixed to the rotor rotates, so that each tray 123, fixed to its corresponding tray rotating shaft 126 which is integral with each tray rotating gear 127 in mesh with the ring gear 135 on the upper end face of the ring-shaped extension portion of the stand 133, rotates around the axis of the shaft 126. Thus, the wafer 124 on each tray 123 rotates around the axis of its corresponding tray rotating shaft 126.

Moreover, the susceptor rotating mechanism 60 is driven. When the output shaft of the electric motor of the mechanism 60 rotates, the susceptor 121 which is integral with the rotating shaft 131 connected to the output shaft, the gas manifold 132, and the stator 102 of the gas-drive motor 101 rotate around the axis of the shaft 131. As the susceptor 121 rotates in this manner, the trays 123, which are integral with their corresponding tray rotating shafts 126 supported by means of the susceptor 121, and the wafers 124 on the trays revolve around the axis of the susceptor.

Since the rotor 103 of the gas-drive motor 101 is lifted above the stator 102 so that the stator and the rotor are disconnected from each other, the rotation of the stator 102 (or wafer revolution) exerts no influence on the wafer rotation. If the rotating shaft 131 is rotated to revolve the wafers, it never hinders the supply of the gases for rotor lifting and rotor rotation from the gas supply system 70 to the motor 101, since the shaft 131 is formed with an annular gas supply passage (not shown) on its peripheral surface.

While the wafers 124 are both rotating and revolving, the material gas, along with the carrier gas, is supplied from the gas supply system 30 in a manner such that the predetermined wafer temperature is kept by heating the susceptor 121 by means of the high-frequency heating coil 137. The flows of the gases introduced into the reactor 120 through the gas feed port 129 are stabilized by means of the cap 128 which is located on the upper-course side of the susceptor 121, and the gases then flow along the peripheral surface of the susceptor 121. As a result, the epitaxial layer gradually grows on the surface of each wafer 124. On the lower-course side of the wafer 124, the gases flow steadily along the peripheral surface of the gear stand 133, and are discharged from the reactor 120 through the exhaust port 130.

Figure 5:
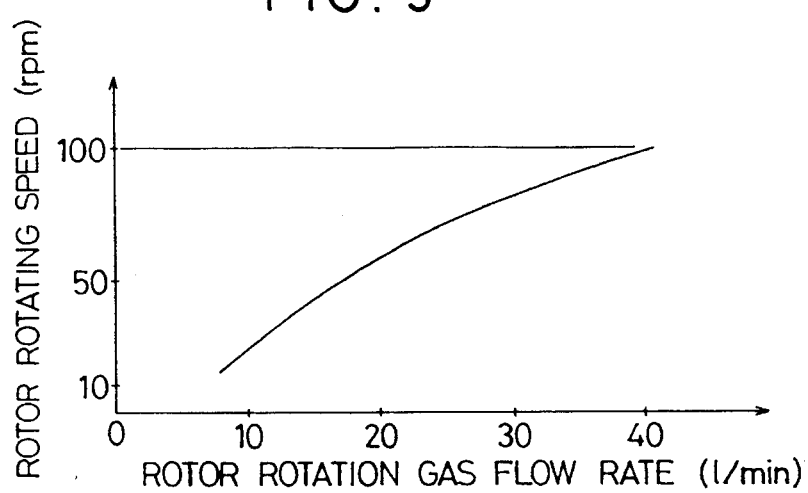
FIG. 5 is a graph for illustrating, by way of example, the relationship between the rotor rotation gas flow rate and rotor rotating speed in the gas-drive motor.

As has been described with reference to FIG. 5, the rotor rotating speed (wafer rotating speed) can be controlled by adjusting the rate of feed of the gas for rotor rotation from the gas supply system 70. Also, the rotating speed of the rotating shaft 131 (wafer revolving speed) can be controlled by means of the control section of the susceptor rotating mechanism 60. Moreover, the wafer rotating speed and the wafer revolving speed can be controlled separately and independently of each other. Optimum wafer rotating and revolving speeds for the vapor phase growth of the epitaxial layer were experimentally obtained in advance, and the wafers 124 were allowed to rotate and revolve at the optimum speeds as the epitaxial layer was formed on each wafer. Thereupon, the differences in the layer thickness was able to be restricted to ±2% or less.

Figure 8:
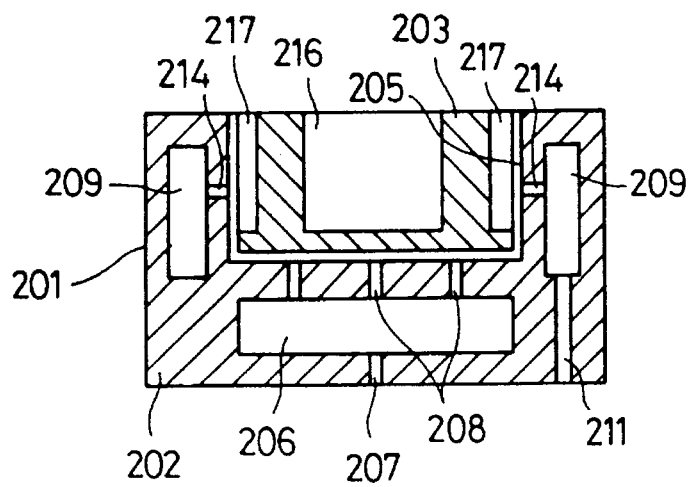
FIG. 8 is a vertical sectional view showing a gas-drive motor according to a second embodiment of the invention.

Referring now to FIG. 8, a gas-drive motor according to a second embodiment of the present invention will be described.

The gas-drive motor of the present embodiment differs from the gas-drive motor (FIGS. 3 and 4) of the first embodiment, whose stator and rotor are ring-shaped, mainly in that its stator and rotor are cylindrical in shape. Thus, the motor of the second embodiment is not provided with any elements which correspond to the through hole 104 and the gas receiving grooves 118 shown in FIG. 3.

More specifically, a cylindrical stator 202 of the gas-drive motor 201 has a peripheral wall and a bottom wall, which define a cylindrical rotor chamber 205, as shown in FIG. 8. The bottom wall of the stator 202 is formed with a cylindrical first gas reservoir 206, a first gas supply passage 207, and a plurality of first gas injection passages 208 which extend parallel to the axis of a susceptor. One end of each of the passages 207 and 208 opens into the first gas reservoir 206. The other end (first gas feed port) of the passage 207 opens in the underside of the bottom wall of the stator 202. The other end (first gas injection port) of each first gas injection passage 208 opens in the upper surface of the bottom wall of the stator 202. Thus, when the gas for rotor lifting is supplied to the gas-drive motor 201, it is injected upward into the rotor chamber 205 through the first gas injection passages 208, thereby lifting a rotor 203 rotatably received in the rotor chamber 205. The rotor 203 is formed with a hollow portion 216 for the reduction of its weight.

The peripheral wall of the stator 202 is formed with an annular second gas reservoir 209, a second gas supply passage 211, and a plurality of second gas injection passages 214. One end of each of the passages 211 and 214 opens into the second gas reservoir 209. The other end of the passage 211 opens in the underside of the peripheral wall of the stator 202. The other end (second gas injection port) of each passage 214 opens in the inner peripheral surface of the peripheral wall of the stator 202. Thus, when the gas for rotor rotation is supplied to the gas-drive motor 201, it is injected toward gas receiving grooves 217, which are formed in the outer peripheral surface of the rotor 203, through the second gas injection ports, thereby rotating the rotor 203.

Since other constructions and functions of the gas-drive motor 201 resemble those of the motor 101 according to the first embodiment, a description of those particulars is omitted.

Figure 9:
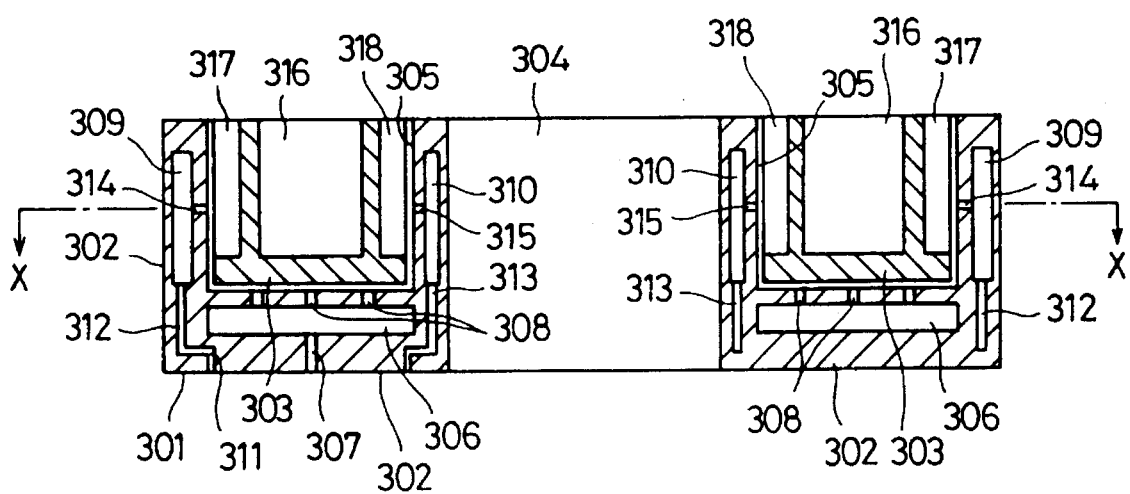
FIG. 9 is a vertical sectional view showing a gas-drive motor according to a third embodiment of the invention.
Figure 10:
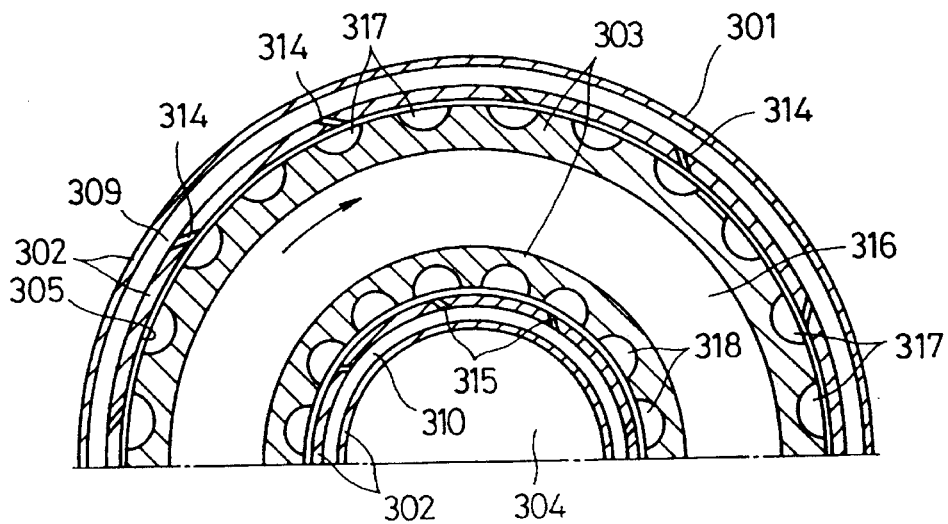
FIG. 10 is a horizontal sectional view of a half of the gas-drive motor taken along line X—X of FIG. 9.

Referring now to FIGS. 9 and 10, a gas-drive motor according to a third embodiment of the present invention will be described.

The gas-drive motor of the present embodiment differs from the motor (FIGS. 3 and 4) of the first embodiment, whose rotor is rotatable in one direction, mainly in that its rotor is reversible. In other respects, the motor of the third embodiment is constructed in the same manner as the motor of the first embodiment. In FIGS. 9 and 10, therefore, corresponding reference numerals are used to designate components which correspond to the components of the motor of the first embodiment, and a description of those components is omitted.

The following is a further description of the aforesaid difference. In the gas-drive motor 301 of the present embodiment, each of third gas injection passages (reverse rotor rotation gas injection passages) 315, which correspond to the passages 115 shown in FIG. 4, extends horizontally as viewed from the front of the apparatus, and across a tangent to that portion of the outer peripheral surface of the inner peripheral wall of a stator 302 at which the passage 315 is formed, as in a plan view. The passage 315, which is formed in the same manner as in the case of the passage 115 with respect to the above points, differs from the passage 115 in that it intersects the aforesaid tangent at an angle different from the angle of intersection between the passage 115 and the tangent. Accordingly, the gas for rotor rotation injected through the passages 315 acts on a rotor 303 so as to rotate it in the reverse direction. The gas for rotor rotation injected through second gas injection passages (forward rotor rotation gas injection passages) 314, like the gas injected through the passages 114 of FIG. 4, acts on the rotor 303 so as to rotate it in the forward direction indicated by the arrow in FIG. 10.

According to the present invention, in connection with the arrangement described above, gas supply paths to the second and third gas injection passages 314 and 315 are provided separately from one another. More specifically, one end of a second gas supply passage 312, the other end of which communicates with the second gas injection passages 314 by means of a second gas reservoir 309 opens in the underside of the bottom wall of the stator 302 on the outer peripheral wall side thereof. On the other hand, one end of a third gas supply passage 313, the other end of which communicates with the third gas injection passages 315 by means of a third gas reservoir 310, opens in the underside of the bottom wall of the stator on the inner peripheral wall side thereof.

When the gas for forward rotor rotation is supplied to the second gas supply passage 312 in the gas-drive motor 301 constructed in the manner described above, it is injected toward gas receiving grooves 317 of the rotor 303 through the second gas reservoir 309 and the second gas injection passages 314, and acts so as to rotate the rotor 303 in the direction indicated by the arrow in FIG. 10. Thus, the rotor 303 rotates in the forward direction as the gas for forward rotor rotation is supplied. When the gas for reverse rotor rotation is supplied to the third gas supply passage 313, on the other hand, it is injected toward gas receiving grooves 318 of the rotor 303 through the third gas reservoir 310 and the third gas injection passages 315, and acts so as to rotate the rotor 303 in the direction opposite to the direction indicated by the arrow in FIG. 10. Thus, the rotor 303 rotates in the reverse direction as the gas for reverse rotor rotation is supplied.

In the gas-drive motor 301, as described above, the rotor 303 can be rotated in the forward and reverse directions. Thus, the rotor 303 can be rotated steadily at a predetermined speed by effecting speed control of the motor 301 taking advantage of this characteristic of the motor.

In forwardly rotating the rotor 303 at the predetermined speed, the gas supply to the second gas supply passage 312 is continued until the predetermined speed is exceeded by the forward rotor rotating speed, for example. When or immediately before the predetermined speed is exceeded by the forward rotor rotating speed, the gas supply to the passage 312 is interrupted, and the gas supply to the third gas supply passage 313 is started. Thereupon, the forward rotor rotating speed can be restored to the predetermined speed in a short period of time. When or immediately before the forward rotor rotating speed falls below the predetermined speed, thereafter, the gas supply to the passage 313 is interrupted, and the gas supply to the second gas supply passage 312 is restarted. When or immediately before the forward rotor rotating speed is exceeded by the predetermined speed again, the gas supply to the passage 312 is interrupted, and the gas supply to the passage 313 is restarted. Thus, the rotor 303 can be forwardly rotated at the predetermined speed with stability.

Likewise, the rotor 303 can be reversely rotated at the predetermined speed with stability.

The rotor rotating speed can be measured for the speed control of the aforementioned gas-drive motor 301 by various methods. For example, a measuring device shown in FIG. 11 comprises a hollow cylindrical stand 338 mounted on the rotor 303 and a hollow skirt 339 having the shape of a truncated cone and formed integrally with the stand 338. The outer peripheral surface of the lower edge portion of the skirt 339 extends parallel to the rotor axis, as viewed along its longitudinal section. The measuring device further comprises an optical reflector 340, which is formed of, e.g., an optical reflective tape pasted on the outer peripheral surface of the lower edge portion of the skirt 339, and a photoelectric rotating speed detector 341 which is opposed to the lower edge portion of the skirt 339.

In this arrangement, the rotor 303 rotates with light emitted from a light emitting section (not shown) of the detector 341 and projected on the lower edge portion of the skirt 339. Every time the optical reflector 340 faces the detector 341 as the rotor 303 rotates in this manner, the light emitted from the detector 341 is reflected on the detector by means of the reflector 340, and is received by a light sensing section (not shown) of the detector 341. In the light sensing section, the reflected light is converted into an electrical signal. The rotor rotating speed is measured in accordance with the interval of generation of this electrical signal.

Figure 11:
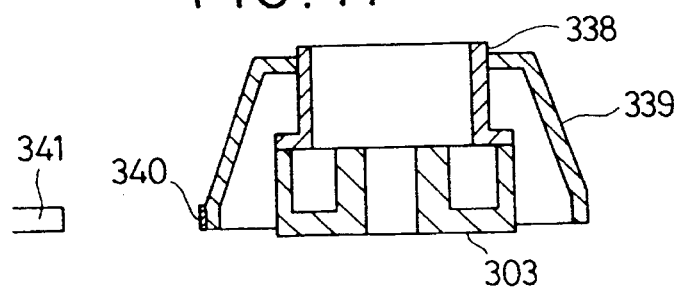
FIG. 11 is a schematic sectional view illustrating a rotor rotating speed measuring device used in rotor rotating speed control for the gas-drive motor shown in FIGS. 9 and 10.

The rotor rotating speed measuring device shown in FIG. 11 can be incorporated in the vapor phase growth system shown in FIG. 2. In this case, for example, the optical reflector 340 shown in FIG. 11 is mounted on the middle portion of the gear stand 133 shown in FIG. 2, and the detector 341 is located outside the reactor 120 so as to face the middle portion of the gear stand 133. Moreover, a transparent window is provided in that region of the reactor 120 which intersects an imaginary line connecting the optical reflector 340 and the detector 341.

Figure 12:
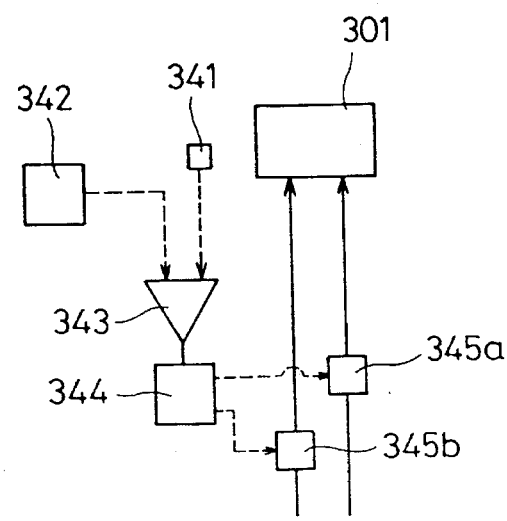
FIG. 12 is a schematic block diagram illustrating a rotor rotating speed control device which includes the rotor rotating speed measuring device of FIG. 11.

A device for controlling the rotor rotating speed of the gas-drive motor 301 can be also constructed variously. For example, a speed control device shown in FIG. 12 comprises the rotating speed detector 341 shown in FIG. 11, a rotating speed setter 342 for setting a target rotor rotating speed, a comparator 343 for receiving the output of the setter 342 and the output of the detector 341 which is indicative of the actual rotor rotating speed, and a signal generator 344 for generating a forward or reverse rotation control signal in accordance with the output of the comparator 343 which is indicative of the result of comparison in the comparator. Forward and reverse rotation control signal output terminals of the signal generator 344 are connected, respectively, to control signal input terminals of flow controllers 345a and 345b, such as mass-flow controllers, for controlling the rates of gas feed to the second and third gas supply passages 312 and 313, respectively, of the gas-drive motor 301.

With this arrangement, the rates of gas feed to the second and third gas supply passages 312 and 313 of the gas-drive motor 301 are controlled in accordance with the difference between the actual rotor rotating speed and the target rotating speed. When the target rotating speed is exceeded by the actual rotating speed in the case where a forward target rotating speed is set, for example, the gas supply to the passage 312 is interrupted, and the gas supply to the passage 313 is started. Alternatively, the gas supply to the passage 313 is started without interrupting the gas supply to the passage 312. When the actual rotor rotating speed falls below the target speed, the gas supply to the passage 313 is stopped. Thereupon, as has already been described with reference to FIGS. 9 and 10, the rotor 303 of the motor 301 rotates steadily at the target speed.

In order to examine the effect of the supply of the reverse rotor rotation gas to the gas-drive motor 301 on the rotor rotation, the inventor hereof measured the time (rotor rotation duration) required before the rotation of the rotor 303 was stopped after the start of supply of the reverse rotation gas at room temperature and under atmospheric pressure while changing the flow rate of the reverse rotation gas within the range from about 3 to 30 l/min. The rotor rotating speed used before the supply of the reverse rotor rotation gas was at 20 rpm, and the supply of the forward rotor rotation gas was interrupted at the start of the reverse rotation gas supply. Other measuring conditions are given as follows:

Outside diameter of rotor: 169.80 mm,

Inside diameter of rotor: 85.20 mm,

Weight of rotor: 4 kg,

Stator-rotor gap: 30 μm,

Gasses for forward and reverse rotation and for rotor lifting: nitrogen,

Gas flow rate for rotor lifting: 5.0 l/min.

Figure 13:
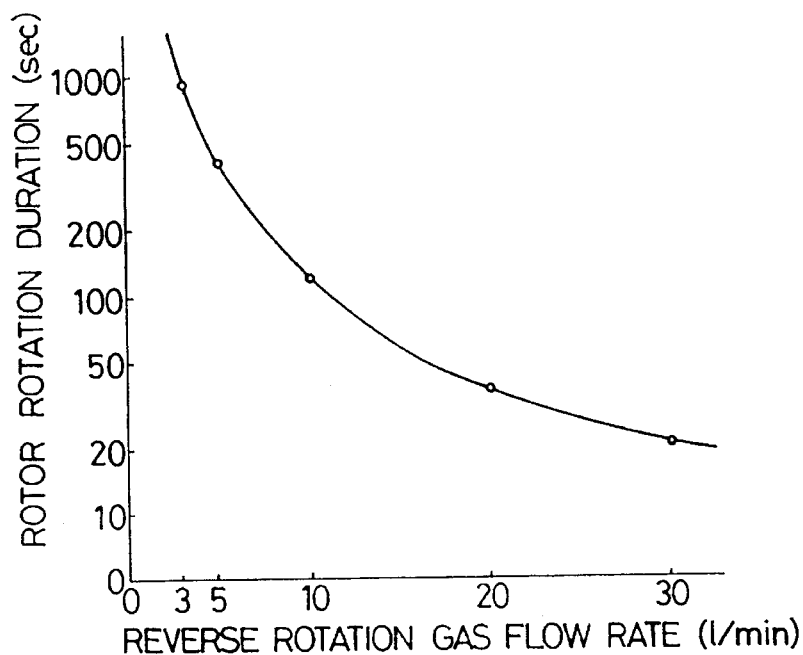
FIG. 13 is a graph for illustrating, by way of example, the relationship between the reverse rotor rotation gas flow rate and rotor rotation duration in the gas-drive motor of FIGS. 9 and 10.

FIG. 13 illustrates the result of the aforesaid measurement. As shown in FIG. 13, the rotor rotation duration was shortened with the increase of the flow rate of the reverse rotor rotation gas. Extrapolation of the rotor rotation duration with the reverse rotation gas flow rate at zero from the curve shown in FIG. 13 indicates that the rotation duration is rather long unless the reverse rotor rotation gas is supplied.

Further, the inventor hereof examined rotor rotating speed control characteristics for the cases where only the forward rotor rotation gas supply to the gas-drive motor 301 was controlled and where the supply of the forward and reverse rotor rotation gases was controlled.

Figure 14:
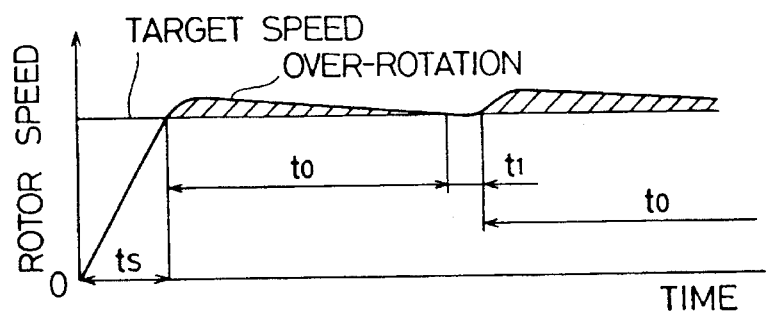
FIG. 14 is a graph showing, by way of example, a characteristic curve for the case of rotor rotating speed control in which only the supply of a forward rotor rotation gas to the gas-drive motor is controlled.

When only the forward rotor rotation gas supply was controlled, a kick-off time ts (e.g., 2 minutes) was required before the target speed (e.g., 20 rpm) was reached, as shown in FIG. 14. After the target speed was reached, an overshot state such that the rotor rotating speed exceeds the target speed continued for a time t0 (e.g., 30 minutes or more). Then, the target speed was maintained for a time t1 which is much shorter than the time t0, and the overshot state continued again for the time t0.

Figure 15:
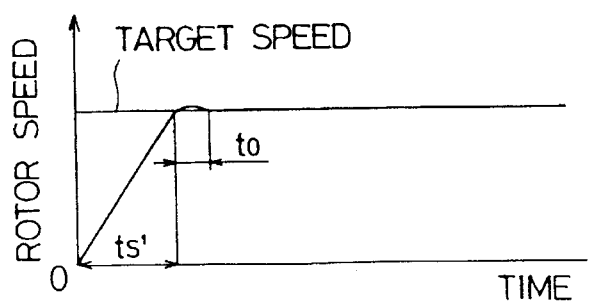
FIG. 15 is a graph showing, by way of example, a characteristic curve for the case of rotor rotating speed control in which the supply of forward and reverse rotor rotation gases to the gas-drive motor is controlled.

When the supply of the forward and reverse rotor rotation gases was controlled to adjust the rotor rotating speed to 20 rpm, on the other hand, a kick-off time ts' of about 20 seconds was required. After reaching the target speed, the rotor rotating speed exceeded it. This overshot state was canceled in a short time t0' (e.g., 3 seconds), whereupon the target speed was maintained thereafter (FIG. 15). The kick-off times ts and ts' vary depending on the weight around the rotor 303 and hence the moment of inertia.

Figure 16:
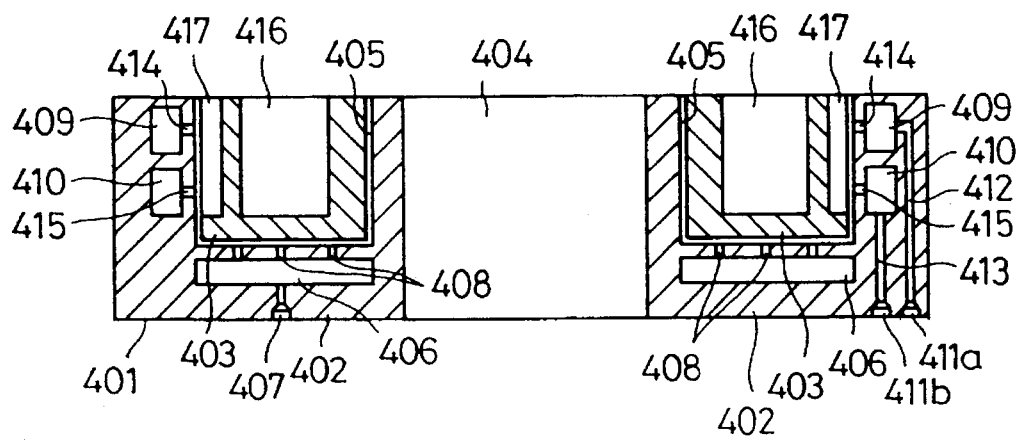
FIG. 16 is a vertical sectional view showing a gas-drive motor according to a fourth embodiment of the invention;/

Referring now to FIG. 16, a gas-drive motor according to a fourth embodiment of the present invention will be described.

The gas-drive motor of the present embodiment resembles that of the third embodiment (FIGS. 9 and 10) in having a reversible rotor. On the other hand, the motor of the present embodiment differs from the motor of the third embodiment in that the arrangements of the stator and rotor are simplified by eliminating the rotor rotation gas receiving grooves on the inner peripheral surface side of the rotor. In FIG. 16, corresponding reference numerals are used to designate components which correspond to the components shown in FIGS. 9 and 10.

The aforesaid difference will be mainly described in the following. As shown in FIG. 16, the outer peripheral wall of a stator 402 of the gas-drive motor 401 is formed with second and third annular gas reservoirs 409 and 410 which correspond to the gas reservoirs 309 and 310 of FIG. 9, respectively. The reservoirs 409 and 410 are arranged substantially in the same position with respect to the radial direction of the rotor 403. With respect to the height direction of the rotor, on the other hand, the second gas reservoir 409 is located over the third gas reservoir 410.

The outer peripheral wall of the stator 402 is formed with second and third gas supply passages 412 and 413 which correspond to the passages 312 and 313 of FIG. 9, respectively, and second and third gas injection passages 414 and 415 which correspond to the passages 314 and 315 of FIG. 9, respectively. The second gas supply passage 412 extends up to the second gas reservoir 409 from a gas feed port 411a which opens in the underside of the bottom wall of the stator 402. The third gas supply passage 413 extends parallel to the passage 412 from a gas feed port 411b to the third gas reservoir 410, and is disposed inwardly of the passage 412 in the radial direction of the stator. The port 411b opens in the underside of the bottom wall of the stator, inside the gas feed port 411a with respect to the radial direction of the stator.

The inner end of each second gas injection passage 414, whose outer end opens into the gas reservoir 409, opens in the inner peripheral surface of a rotor chamber 405. Each third gas injection passage 415 extends parallel to its corresponding passage 414, and is located under the passage 414 with respect to the height direction of the stator. The outer end of each passage 415 opens into the gas reservoir 410, and the inner end thereof in the inner peripheral surface of the rotor chamber 405. Although an illustration is omitted, each of the gas injection passages 414 and 415, like the passages 314 and 315 shown in FIG. 10, extends across a tangent to that portion of the outer peripheral surface of the outer peripheral wall of the stator 402 at which the passage is formed, as in a plan view. The angles of intersection between each passage 414 and the tangent and between each passage 415 and the tangent are adjusted to values such that the rotor rotation gas injected through the passages 414 acts in the direction of forward rotation of the rotor, and that the rotor rotation gas injected through the passages 415 acts in the direction of reverse rotation of the rotor. Thus, the rotor can be rotated in the forward and reverse directions, as in the case of the third embodiment.

Since other constructions and functions of the motor of the present embodiment resemble those of the motor of the third embodiment, a description of those particulars is omitted.

Figure 17:
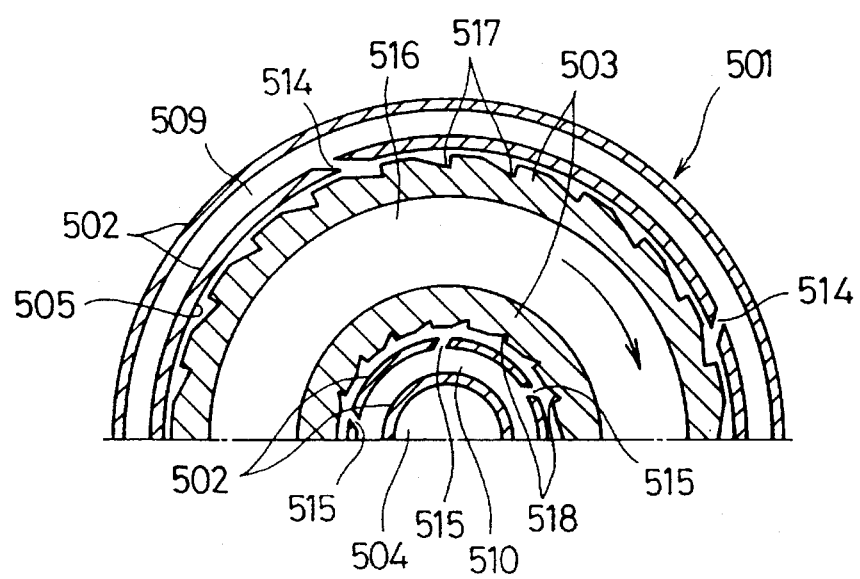
FIG. 17 is a horizontal sectional view showing a half of a gas-drive motor according to a fifth embodiment of the invention.

Referring now to FIG. 17, a gas-drive motor according to a fifth embodiment of the present invention will be described.

The motor of the present embodiment has the same basic configuration as the motor (FIGS. 9 and 10) of the third embodiment. More specifically, as shown in FIG. 17, the gas-drive motor 501 comprises a stator 502, which is formed with a through hole 504, and a rotor 503 in a rotor chamber 505 which is formed in the stator. The outer peripheral wall of the stator 502 is formed with gas injection passages 514 which are communicated with a gas reservoir 509. The inner peripheral wall of the stator is formed with gas injection passages 515 which are communicated with a gas reservoir 510. Moreover, the rotor 503 is formed with a hollow portion 516, and its outer and inner peripheral surfaces are formed with rotor rotation gas receiving grooves 517 and 518, respectively.

The gas-drive motor 501 differs from the motor 301 of the third embodiment, whose rotor rotation gas receiving grooves 317 and 318 have a semicircular horizontal section, in that the rotor rotation gas receiving grooves 517 and 518 have a horizontal section in the shape of an inequilateral triangle. With this arrangement, the kinetic energy of the rotor rotation gas can be efficiently converted into energy for rotor rotation, thereby increasing the rotor torque. More specifically, each of the gas receiving grooves 517 has a shape such that its long side extends in the same direction as the gas injection passages 514 and its Short side substantially at right angles to the passages 514, as viewed in horizontal cross section, when it faces one of the passages 514. The gas receiving grooves 518 have the same shape as the grooves 517.

The vapor phase growth system and the gas-drive motor of the present invention are not limited to the ones according to the first and fifth embodiments described herein, and may be changed or modified variously.

According to the first embodiment, for example, the gas-drive motor 101 is used as a drive source for wafer rotation in the vapor phase growth system. Alternatively, however, this motor may be used as a drive source for rotation in any other suitable apparatuses than the vapor phase growth system. Moreover, the gas-drive motors 201 to 501 according to the second to fifth embodiments may be used as drive sources for wafer rotation in various vapor phase growth systems, including the one shown in FIG. 2, or drive sources for rotation in apparatuses other than vapor phase growth systems. In the case where the motors 101 to 501 of the above-described embodiments are used in the vapor phase growth system, it is preferable to use an inert gas, such as nitrogen or argon, as the gases for rotor lifting and rotor rotation. If the motors 101 to 501 are used in general-purpose industrial apparatuses, however, some other gas than an inert gas, e.g., air, may be used instead.

In the gas-drive motor 201 (FIG. 8) according to the second embodiment, the rotor 203 is rotatable only in one direction. Alternatively, however, the motor 201 may be modified so that the rotor 203 is rotatable in the forward and reverse directions, with reference to the teaching given above in connection with the motor 401 (FIG. 16) according to the fourth embodiment in which the rotor 403 is reversible.

Although the rotor rotating speed measuring device according to the third embodiment is of the photoelectric type (FIG. 11), a magnetic or ultrasonic measuring device may be used instead. Preferably, the measuring device should be of a non-contact type lest the rotor be subjected to a resistance during the measurement of the rotor rotating speed.

The rotor rotation gas receiving grooves have a semicircular horizontal section according to the first to fourth embodiments and a section in the shape of an inequilateral triangle according to the fifth embodiment. Alternatively, however, the rotor rotation gas receiving grooves (recesses, in general) may be in any other shape, e.g., the shape of an equilateral triangle. Thus, the gas receiving grooves may be symmetrical or asymmetrical in shape, as viewed from their opening side.

According to the first embodiment, the rotor 103 is rotated by injecting the gases through the rotor rotation gas injection passages 114 and 115 which are formed in the outer and inner peripheral walls of the stator 102, respectively. Alternatively, however, the gases may be injected through only the injection passages of one category. In this case, the elements associated with the injection passages of the other category on the stator and rotor sides may be eliminated.

In order to rationalize the state of rotor lifting, according to the individual embodiments described herein, the gas supply paths for rotor lifting and rotor rotation are provided separately from each other. Alternatively, however, the two paths for rotor lifting and rotor rotation may be united entirely or partially.

What is claimed is:

1. A vapor phase growth system comprising:
    a reactor receiving therein a susceptor;
    a tray arranged along an outer surface of the susceptor so as to be rotatable around an axis of the tray and adapted to support a wafer;
    a heating system for heating at least the susceptor to a high temperature for carrying out vapor phase growth;
    a gas-drive motor including a stator and a rotor which is rotatable with respect to the stator; and
    a transmission mechanism having one side coupled to the rotor and another side and coupled to the tray; and
    wherein the stator is formed with a rotor chamber, and the rotor is received in the rotor chamber so as to be liftable and rotatable with respect to the stator.

2. A vapor phase growth system according to claim 1, further comprising:
    a drive mechanism for rotating the susceptor; and
    wherein the tray rotates around an axis of the susceptor as the susceptor rotates.

3. A vapor phase growth system comprising:
    a reactor receiving therein a susceptor;
    a tray arranged along an outer surface of the susceptor so as to be rotatable around an axis of the tray and adapted to support a wafer;
    gas-drive motor including a stator and a rotor which is rotatable with respect to the stator; and
    a transmission mechanism having one side coupled to the rotor and another side coupled to the tray, said transmission mechanism including:
        a rotating member having one end thereof fixed to the rotor and another end formed with a gear,
        a shaft member having one end thereof fixed to the tray, and
        a further gear fixed to another end of the shaft member and being in mesh with the gear of the rotating member.

4. A vapor phase growth system comprising:
    a reactor receiving therein a susceptor, said susceptor having a top wall and a peripheral wall which cooperates with the top wall to define a hollow portion;
    a tray arranged along an outer surface of the susceptor so as to be rotatable around an axis of the tray and adapted to support a wafer;
    a gas-drive motor including a stator and a rotor which is rotatable with respect to the stator, said stator and said rotor of said gas-drive motor being ring-shaped, said ring-shaped stator defining a center hole;
    a transmission mechanism having one side coupled to the rotor and another side coupled to the tray, said transmission mechanism including:
        a hollow rotating member extending along an axis of the susceptor, the hollow rotating member having one end thereof fixed to the rotor and another end formed with a ring gear, and having a hollow portion inside,
        a shaft member having one end thereof fixed to the tray and penetrating the peripheral wall of the susceptor, and
        a gear fixed to another end of the shaft member and being in mesh with the ring gear of the hollow rotating member; and
    a drive mechanism for rotating the susceptor, the drive mechanism having a rotating shaft extending along the axis of the susceptor through the center hole of the gas-drive motor and the respective hollow portions of the hollow rotating member and the susceptor, said rotating shaft being fixed at one end thereof to the top wall of the susceptor; and
    wherein the tray rotates around the axis of the susceptor as the susceptor rotates.

5. A vapor phase growth system comprising:
    a reactor receiving therein a susceptor;
    a tray arranged along an outer surface of the susceptor so as to be rotatable around an axis of the tray and adapted to support a wafer;
    a gas-drive motor including a stator and a rotor which is rotatable with respect to the stator;
    a transmission mechanism having one side coupled to the rotor and another side coupled to the tray; and
    a drive mechanism for rotating the susceptor, the drive mechanism having a rotating shaft which is movable in an axial direction of the susceptor, and wherein the stator of the gas-drive motor is fixed to the rotating shaft; and
    wherein the tray rotates around an axis of the susceptor as the susceptor rotates.

6. A vapor phase growth system comprising:
    a reactor receiving therein a susceptor;
    a tray arranged along an outer surface of the susceptor so as to be rotatable around an axis of the tray and adapted to support a wafer;
    a gas-drive motor including a stator and a rotor which is rotatable with respect to the stator;
    the stator of the gas-drive motor being formed with a rotor chamber receiving the rotor such that the rotor is liftable and rotatable with respect to the stator, a first gas passage having a first gas injection port opening in a bottom face of the rotor chamber of the stator, and a second gas passage having a second gas injection port opening in a peripheral surface of the rotor chamber of the stator;

the rotor of the gas-drive motor having a bottom face and a peripheral surface formed with a plurality of gas receiving recesses; and a transmission mechanism having one side coupled to the rotor and another side coupled to the tray.

7. A vapor phase growth system according to claim 6, wherein said second gas passage includes a forward rotor rotation gas injection passage having a gas injection port and a reverse rotor rotation gas injection passage having a gas injection port, said forward rotor rotation gas injection passage extending in a direction such that a gas injected from the gas injection port thereof toward a corresponding one or ones of the gas receiving recesses in the peripheral surface of the rotor acts so as to rotate the rotor in a forward direction, said reverse rotor rotation gas injection passage extending in a direction such that a gas injected from the gas injection port thereof toward a corresponding one or ones of the gas receiving recesses in the peripheral surface of the rotor acts so as to rotate the rotor in a reverse direction; and wherein said vapor phase growth system includes a gas supply control device for controlling supply of the gases to the forward rotor rotation gas injection passage and the reverse rotor rotation gas injection passage.

8. A gas-drive motor comprising:

a stator formed with a rotor chamber, said stator being formed with a first gas passage having a first gas injection port opening in a bottom face of the rotor chamber of the stator and a second gas passage having a second gas injection port opening in a peripheral surface of the rotor chamber of the stator; and a rotor received in the rotor chamber so as to be liftable and rotatable with respect to the stator, said rotor having a bottom face and a peripheral surface formed with a plurality of gas receiving recesses.

9. A gas-drive motor according to claim 8, wherein said first gas passage includes a first gas injection passage having the first injection port and a first gas supply passage communicating therewith, and said second gas passage includes a second gas injection passage having the second injection port and a second gas supply passage communicating therewith.

10. A gas-drive motor according to claim 9, wherein said first gas passage includes a first gas reservoir interposed between the first gas injection passage and the first gas supply passage, and said second gas passage includes a second gas reservoir interposed between the second gas injection passage and the second gas supply passage.

11. A gas-drive motor according to claim 10, wherein said stator has a bottom wall and a peripheral wall which cooperates with the bottom wall to define the rotor chamber, said bottom and peripheral walls of said stator being formed with first and second gas reservoirs, respectively.

12. A gas-drive motor according to claim 8, wherein said second gas passage includes a forward rotor rotation gas injection passage having a gas injection port and a reverse rotor rotation gas injection passage having a gas injection port;

wherein said forward rotor rotation gas injection passage extends in a direction such that a gas injected from the gas injection port thereof toward a corresponding one or ones of the gas receiving recesses in the peripheral surface of the rotor acts so as to rotate the rotor in a forward direction; and wherein said reverse rotor rotation gas injection passage extends in a direction such that a gas injected from the gas injection port thereof toward a corresponding one or ones of the gas receiving recesses in the peripheral surface of the rotor acts so as to rotate the rotor in a reverse direction.

13. A gas-drive motor according to claim 12, wherein said second gas passage includes a forward rotor rotation gas reservoir communicating with that end of the forward rotor rotation gas injection passage which is situated on the side opposite from the gas injection port thereof, and a reverse rotor rotation gas reservoir communicating with that end of the reverse rotor rotation gas injection passage which is situated on the side opposite from the gas injection port thereof.

14. A gas-drive motor according to claim 8, wherein said stator has an outer peripheral wall and an inner peripheral wall which cooperates with the outer peripheral wall to define the rotor chamber;

wherein said rotor has outer and inner peripheral surfaces;

wherein said plurality of gas receiving recesses include a plurality of forward rotor rotation gas receiving recesses formed in one of the outer and inner peripheral surfaces of the rotor and a plurality of reverse rotor rotation gas receiving recesses formed in the other of the outer and inner peripheral surfaces of the rotor;

wherein said second gas passage includes a forward rotor rotation gas injection passage having a gas injection port opening in that one of the respective outer surfaces of the outer and inner peripheral walls of the stator which corresponds to one of the outer and inner peripheral surfaces of the rotor, and a reverse rotor rotation gas injection passage having a gas injection port opening in that one of the respective outer surfaces of the outer and inner peripheral walls of the stator which corresponds to the other of the outer and inner peripheral surfaces of the rotor; and wherein said forward rotor rotation gas injection passage extends in a direction such that a gas injected from the gas injection port thereof toward a corresponding one or ones of the gas receiving recesses in the peripheral surface of the rotor acts so as to rotate the rotor in a forward direction, said reverse rotor rotation gas injection passage extending in a direction such that a gas injected from the gas injection port thereof toward a corresponding one or ones of the gas receiving recesses in the peripheral surface of the rotor acts so as to rotate the rotor in a reverse direction.

15. A gas-drive motor system comprising:

a gas-drive motor including a stator formed with a rotor chamber and a rotor received in the rotor chamber so as to be liftable and rotatable with respect to the stator and having a bottom face and a peripheral surface formed with a plurality of gas receiving recesses, said stator being formed with a first gas passage having a first gas injection port opening in a bottom face of the rotor chamber of the stator and a second gas passage, said second gas passage including a forward rotor rotation gas injection passage having a gas injection port opening in the bottom face of the rotor chamber of the stator and a reverse rotor rotation gas injection passage having a gas injection port, said forward rotor rotation gas injection passage extending in a direction such that a gas injected from the gas injection port thereof toward a corresponding one or ones of the gas receiving recesses in the peripheral surface of the rotor acts so as to rotate the rotor in a forward direction, said reverse rotor rotation gas injection passage extending in a direction such that a gas injected from the gas injection port thereof toward a corresponding one or ones of the gas receiving recesses in the peripheral surface of the rotor acts so as to rotate the rotor in a reverse direction; and a gas supply control device for controlling supply of the gases to the forward rotor rotation gas injection passage and the reverse rotor rotation gas injection passage.

16. A gas-drive motor system according to claim 15, wherein said gas supply control device includes a speed detector for detecting a rotor rotating speed and a controller for controlling gas supply to the forward and reverse rotor rotation gas injection passages in accordance with a result of comparison between the rotor rotating speed and a target speed based on an output of the speed detector.

17. A gas-drive motor system according to claim 16, wherein said controller operates so as to stop a corresponding one of the gas supply to the forward rotor rotation gas injection passage and the gas supply to the reverse rotor rotation gas injection passage and start the other of the gas supply to the forward rotor rotation gas injection passage and the gas supply to the reverse rotor rotation gas injection passage when the rotor rotating speed is deviated from the target speed.

18. A gas-drive motor system according to claim 16, wherein said controller operates so as to start a corresponding one of the gas supply to the forward rotor rotation gas injection passage and the gas supply to the reverse rotor rotation gas injection passage when the rotor rotating speed is deviated from the target speed while continuing the other of the gas supply to the forward rotor rotation gas injection passage and the gas supply to the reverse rotor rotation gas injection passage.

19. A gas-drive motor system according to claim 16, wherein said controller includes a setter for setting the target rotor rotating speed and a comparator for comparing respective outputs of the speed detector and the setter, and controls the gas supply to the forward and reverse rotor rotation gas injection passages in accordance with an output of the comparator.

* * * * *